(12) United States Patent
Xie et al.

(10) Patent No.: US 8,148,874 B2
(45) Date of Patent: Apr. 3, 2012

(54) MICROACTUATOR HAVING MULTIPLE DEGREES OF FREEDOM

(75) Inventors: Huikai Xie, Gainesville, FL (US); Shane T. Todd, Santa Barbara, CA (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 362 days.

(21) Appl. No.: 11/817,378

(22) PCT Filed: Apr. 13, 2006

(86) PCT No.: PCT/US2006/014189
§ 371 (c)(1),
(2), (4) Date: Jun. 23, 2009

(87) PCT Pub. No.: WO2006/110908
PCT Pub. Date: Oct. 19, 2006

(65) Prior Publication Data
US 2009/0261688 A1 Oct. 22, 2009

Related U.S. Application Data

(60) Provisional application No. 60/671,894, filed on Apr. 15, 2005.

(51) Int. Cl.
*H02N 10/00* (2006.01)
*H02N 1/00* (2006.01)

(52) U.S. Cl. ........ 310/307; 310/309; 310/331; 310/332; 359/224.1; 359/847; 359/848

(58) Field of Classification Search .................. 310/307, 310/309, 328, 330–332; 359/198.1, 224, 359/847, 848, 898; 257/414–415
See application file for complete search history.

(56) References Cited

U.S. PATENT DOCUMENTS

| 3,947,644 | A | * | 3/1976 | Uchikawa .................. 310/332 |
| 5,015,850 | A | | 5/1991 | Zdeblick et al. |
| 5,410,207 | A | | 4/1995 | Miura et al. |
| 5,808,434 | A | | 9/1998 | Kokura et al. |
| 6,091,050 | A | * | 7/2000 | Carr .......................... 219/201 |
| 6,233,124 | B1 | | 5/2001 | Budde et al. |
| 6,239,685 | B1 | | 5/2001 | Albrecht et al. |

(Continued)

FOREIGN PATENT DOCUMENTS

EP 1 043 716 A2 10/2000

(Continued)

OTHER PUBLICATIONS

Xie et al., "Post—CMOS Processing for High-Aspect-Ratio Integrated Silicon Microstructures" in the Journal of Microelectromechanical Systems, 11: 93-101 (2002).

(Continued)

*Primary Examiner* — Quyen Leung
*Assistant Examiner* — Thomas Truong
(74) *Attorney, Agent, or Firm* — Thomas, Kayden, Horstemeyer & Risley, LLP

(57) ABSTRACT

A MEMS vertical displacement device for vertically displacing and tilting a vertically displaceable platform. The vertically displaceable platform may be displaced using a plurality of recurve actuators configured to provide vertical displacement without horizontal movement. The vertically displaceable platform may be tilted about two axes to yield tilting that is advantageous in numerous applications. The recurve actuators may be thermal, piezoelectric or formed from other appropriate materials.

31 Claims, 14 Drawing Sheets

U.S. PATENT DOCUMENTS

| | | | |
|---|---|---|---|
| 6,239,952 B1 | 5/2001 | Bonin | |
| 6,244,096 B1* | 6/2001 | Lewis et al. | 73/23.2 |
| 6,275,325 B1* | 8/2001 | Sinclair | 359/291 |
| 6,329,738 B1* | 12/2001 | Hung et al. | 310/309 |
| 6,360,539 B1* | 3/2002 | Hill et al. | 60/528 |
| 6,459,473 B1 | 10/2002 | Chang et al. | |
| 6,504,643 B1* | 1/2003 | Peeters et al. | 359/290 |
| 6,515,834 B1 | 2/2003 | Murphy | |
| 6,679,055 B1* | 1/2004 | Ellis | 60/527 |
| 6,753,959 B2* | 6/2004 | Hammer et al. | 356/330 |
| 6,754,047 B2 | 6/2004 | Pan et al. | |
| 6,979,937 B2* | 12/2005 | Masters et al. | 310/332 |
| 7,749,792 B2* | 7/2010 | Fedder et al. | 438/54 |
| 2002/0060887 A1 | 5/2002 | Wu et al. | |
| 2002/0190604 A1 | 12/2002 | Shibaike et al. | |
| 2003/0039693 A1* | 2/2003 | Sandhage | 424/484 |
| 2003/0090783 A1* | 5/2003 | So | 359/337.11 |
| 2003/0123196 A1 | 7/2003 | Shiraishi et al. | |
| 2003/0168942 A1* | 9/2003 | Iino et al. | 310/331 |
| 2003/0184189 A1 | 10/2003 | Sinclair | |
| 2003/0202292 A1 | 10/2003 | Arya et al. | |
| 2003/0206364 A1 | 11/2003 | Wu et al. | |
| 2004/0021989 A1 | 2/2004 | Ma | |
| 2004/0218877 A1* | 11/2004 | Xie | 385/93 |
| 2005/0040736 A1 | 2/2005 | Topliss et al. | |
| 2005/0067919 A1* | 3/2005 | Horning | 310/309 |
| 2005/0140987 A1* | 6/2005 | Xie | 356/512 |
| 2005/0253487 A1* | 11/2005 | Allan et al. | 310/331 |
| 2005/0258715 A1* | 11/2005 | Schlabach | 310/331 |
| 2007/0284968 A1* | 12/2007 | Takeuchi | 310/332 |
| 2010/0033788 A1* | 2/2010 | Xie et al. | 359/198.1 |
| 2010/0307150 A1* | 12/2010 | Wu et al. | 60/528 |

FOREIGN PATENT DOCUMENTS

| | | |
|---|---|---|
| EP | 1043716 A | 10/2000 |
| GB | 2 405 550 A | 3/2005 |
| GB | 2405550 A | 3/2005 |
| WO | 2006047156 A | 5/2006 |
| WO | WO 2006/047156 A2 | 5/2006 |

OTHER PUBLICATIONS

Ervin et al., "Recurve Piezoelectric-Strain-Amplifying Actuator Architecture" IEEE/ASME Transaction on Mechatronics, 3:4 293-301 (1998).

Matey et al., "Bimorph-driven x-y-z translation stage for scanned image microscopy" Rev. Sci. Instrum. 58:4 567-570 (1987).

Oz et al., "CMOS Electrothermal Lateral Micromovers for Actuation and Self-Assembly" Dept. of Electrical & Computer Engineering & the Robotics Institute, 1-7 (Jun. 2003).

Todd et al., "A multi-degree-of-freedom micromirror utilizing inverted-series-connected bimorph actuators," J. Opt. A: Pure Appl. Opt 8, S352-S359 (Jun. 2006).

Todd et al., "A 3-D Micromirror Utilizing Inverted-Series-Connected Electrothermal Bimorph . . . ," 2005 IEEE/LEOS Internat'l Conf. on Optical MEMS, Oulu, Finland (Aug. 2005).

Baginsky, et al., "Linear Electrostatic Micromotors for Nano-and Micro-Positioning," Inst. of Automation and Electrometry Russian Academy of Sciences, 2003.

Chu, et al., "A Micromachined 2D Positioner with Electrothermal Actuation and Sub-Nanometer Capacitive Sensing," Journal of Micromechanics and Microengineering v. 13 n. 2 Mar. 2, 2003, pp. 279-285.

Bergander, et al., Micropositioners for Microscopy Applications Based on the Stick-Slip Effect,: Proceedings of the 2000 International Symposium on Micromechanics and Human Science 2000. pp. 213-216.

Cusin, et al., "Compact and Precise Positioner Based on the Inchworm Principle," Journal of Micromechanics and Microengineering v. 10, n. 4 Dec. 4, 2000, pp. 516-521.

Chang, et al., "Ultra-Precision XY O //Z Piezo-Micropositioner Part II: Experiement and Performance," IEEE Transactions on Ulltrasonics, Ferroelectrics, and Frequency Control, v. 46 n. 4 1999, pp. 906-912.

Wang, et al., "Design and Characterization of a Linear Motion Piezoelectric Micropositioner," IEEE Control Systems Magazine, v. 10, n. 2, Feb. 1990.

Sehr, et al., "Fabrication and Test of Thermal Vertical Bimorph Actuators for Movement in the Wafer Plane," 2001 J. Micromech. Microeng. 11 pp. 306-310, 2001.

Sehr, et al., "Time Constant and Lateral Resonances of Thermal Vertical Bimorph Actuators," 2002 J. Micromech. Microeng. vol. 12, No. 4, Jul. 2002, pp. 410-413.

Syms, et al., "Robust Latching MEMS Translation Stages for Micro-Optical Systems," 2001 J. Micromech. Microeng. vol. 14 pp. 667-674, 2004.

Peters, et al., "Piezoelectric Bimorph-Based Translation Device for Two-Dimensional, Remote Micropositioning," Review of Scientific Instruments, Jan. 1989, vol. 60, Issue 1, p. 138.

Brissaud, "Modelling of Non-Symmetric Piezoelectric Bimorphs," J. Micromech. Microeng. Nov. 1, 2004, vol. 14, Issue 11, p. 1507.

Friend, et al., "A Piezoelectric Linear Actuator Formed From A Multitude of Bimorphs," Sensors & Actuators A: Physical; Jan. 2004, vol. 109, Issue 3, p. 242.

Taya, et al., "Design of Bimorph Piezo-Composite Actuators with Functionally Graded Microstructure," Sensors & Actuators A: Physical; Nov. 2003, vol. 107, Issue 3, p. 248.

Chen, et al., "A Reliable Single-Layer Out-of-Plane Micromachined Thermal Actuator," Sensors & Actuators A: Physical; Jan. 2003, vol. 103, Issue 1/2, p. 48.

Mulcahey, "Bimorph Actuators Buy More Control," Machine Design; Apr. 2, 1998, vol. 70, Issue 6, p. 70.

Peng, et al., "Design and Implementation of a Dual-Stage Actuated HDD Servo System Via Composite Nonlinear Control Approach," Mechatronics; Nov. 2004, vol. 14, Issue 9, p. 965.

The International Search Report and Written Opinion, dated Nov. 9, 2006.

The International Preliminary Report on Patentability, dated Oct. 25, 2007.

* cited by examiner

MICROACTUATOR HAVING MULTIPLE DEGREES OF FREEDOM

CROSS-REFERENCE TO RELATED APPLICATIONS

This application is the national stage entry of International Application No. PCT/US2006/014189, filed Apr. 13, 2006, under the PCT in the U.S. Receiving Office of the United States Patent and Trademark Office, which claims priority to U.S. Provisional Patent Application No. 60/671,894 filed Apr. 15, 2005, the disclosures of both of which are hereby incorporated by reference.

STATEMENT REGARDING GOVERNMENT LICENSE RIGHTS

This invention was made with government support under agreement BES-0423557 awarded by the National Science Foundation. The Government has certain rights in the invention.

FIELD OF THE INVENTION

This invention is directed generally to vertical displacement devices, and more particularly to microelectromechanical vertical displacement devices and use of these devices in optical and biomedical applications.

BACKGROUND

Microelectromechnical system (MEMS) devices are devices that operate on a very small scale, typically in a range of tens of microns to a few millimeters. MEMS devices mostly are fabricated using integrated circuits (IC) technology. Production of MEMs devices enables relatively low manufacturing costs to be realized because of the batch fabrication techniques and the small size of the devices. MEMS devices include many different devices used for a variety of purposes. One device in particular is a movable micromirror having the capability of rotating about a pivot point or an axis. One end of the micromirror is attached to an anchor, which may be a substrate, using a bimorph actuator that may be activated by sending an electrical current to a heating element in the actuator or by applying a voltage to piezoelectric materials in the bimorph. The current causes the temperature of the actuator in the micromirror to increase, which in turn causes the actuator to bend. The voltage applied to piezoelectric bimorphs causes the materials to expand and contract which causes the actuator to bend. While the micromirror may be rotated about a pivot point, the micromirror may not be translated to another position. Instead, the micromirror is fixedly attached to the anchor.

Numerous actuator devices have been used with MEMS devices to achieve vertical displacement. For instance, displacement devices have been used to form a piston action to move an object up and down along an axis. However, there exists a need for controlled rotation and translation of surfaces in MEMS devices about one or more axes.

SUMMARY OF THE INVENTION

This invention relates to a vertical displacement device capable of vertically displacing and tilting one or more vertically displaceable platforms relative to a base for out of plane displacement. In particular, the vertical displacement device may be capable of raising a vertically displaceable platform so that the vertically displaceable platform remains generally parallel to a base. In addition, the vertical displacement device is adapted to tilt the vertically displaceable platform about two axes, which enables two dimensional (2D) rotation. In at least one embodiment, the vertical displacement device may be a MEMS device. The vertically displaceable platform may be, but is not limited to, a microlens, a micromirror, a needle, a tunable capacitor, an infrared detector, a Fabry-Perot optical filter, or other device.

The vertical displacement device may be formed from first and second actuator devices coupled to an anchor and to a vertically displaceable platform. The first side actuator device may be formed from at least one first recurve actuator having a first section that curves in a first direction and a second section that curves is a second direction that is generally opposite to the first direction, wherein a first end of the first recurve actuator is attached to the anchor. The first side actuator device may also include at least one second recurve actuator having a first end attached to a second end of the at least one first recurve actuator and having a first section that curves in a first direction that is generally opposite to the direction of curvature of the second section of the first recurve actuator and a second section that curves in a second direction that is generally opposite to the first direction of curvature of the at least one second recurve actuator. Such movement results in vertical movement of a point on the second end of the second section with no tangential angle. Thus, the first and second side actuator devices are capable of producing vertical displacement. In at least one embodiment, the first and second side actuator devices are formed from two recurve actuators positioned parallel to each other.

In another embodiment, the vertical displacement device may include third and fourth side actuator devices positioned parallel to each other and generally offset relative to each other. The third and fourth actuator devices may be positioned generally orthogonally to the first and second actuator devices. The third and fourth side actuators may control vertical displacement and tilt about an axis that is generally orthogonal to an axis about which the first and second side actuator devices control the vertical displacement and tilt of the vertically displaceable platform. The third and fourth side actuators used together with the first and second side actuators enable control of vertical displacement and 2D tilt of the vertically displaceable platform.

The recurve actuators may be formed from a thermal, piezoelectric, or other type drive actuator. A thermal actuator may be formed from a first section having a first material with a lower coefficient of thermal expansion (CTE) positioned adjacent to and over a second material with a higher CTE. A second section of the recurve actuator may include a higher CTE material positioned adjacent to and over a lower CTE material. This configuration enables the actuator to vertically displace a point on the second recurve actuator with no tangential angle. In addition, the horizontal displacement of the first and second recurve actuators cancel each other out so that vertical displacement without horizontal displacement is achieved. Alternatively, the actuators may be formed from the same piezoelectric materials and operate with different polarities and voltages.

An advantage of this invention is that a vertically displaceable platform in a MEMS device may be moved vertically and tilted about two axes, thereby enabling two dimensional rotation of the platform and three dimensional movement.

These and other embodiments are described in more detail below.

BRIEF DESCRIPTION OF THE DRAWINGS

The accompanying drawings, which are incorporated in and form a part of the specification, illustrate embodiments of the presently disclosed invention and, together with the description, disclose the principles of the invention.

DETAILED DESCRIPTION OF THE INVENTION

Figure 1:
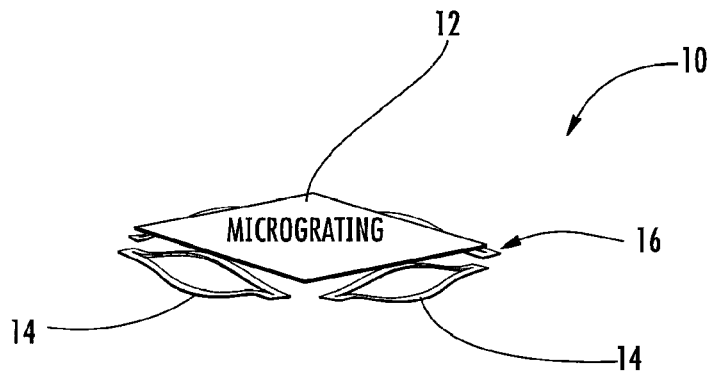
FIG. 1 is perspective view of a vertical displacement device of this invention.
Figure 29:
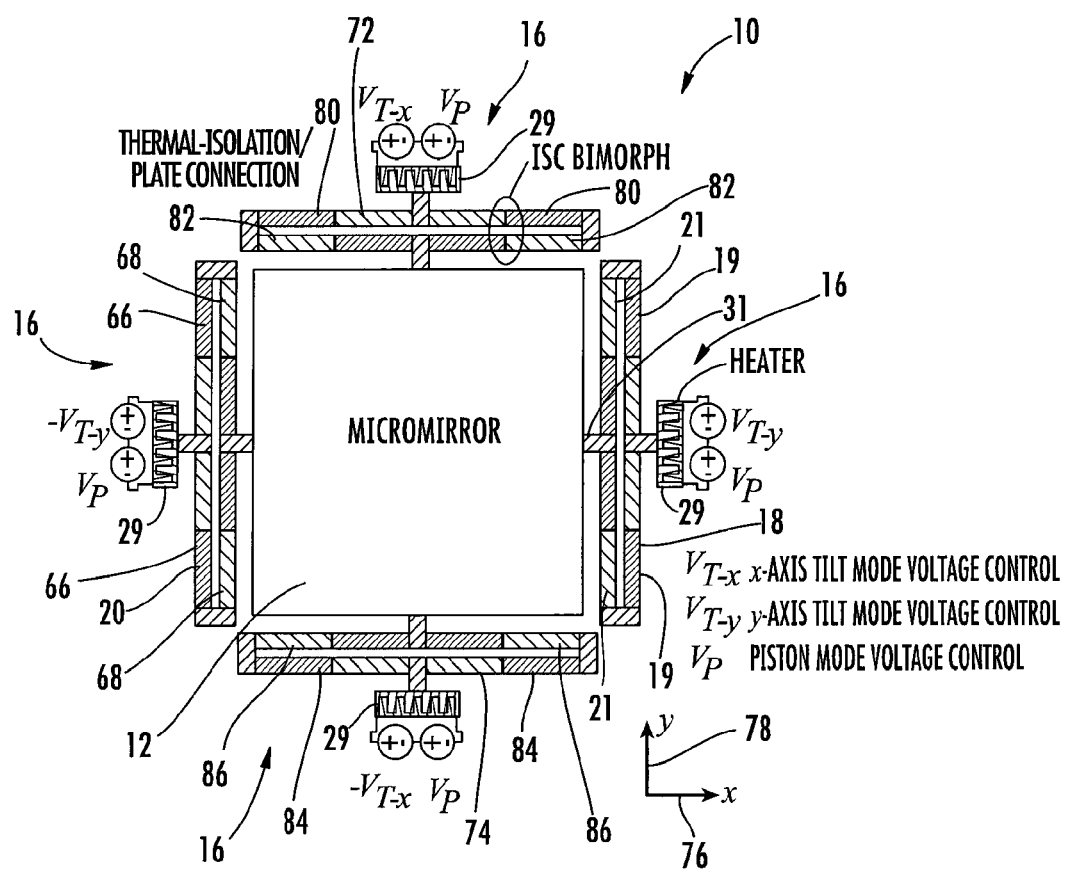
FIG. 29 is a top plan view of a vertical displacement device having four thermal side actuator devices.
Figure 30:
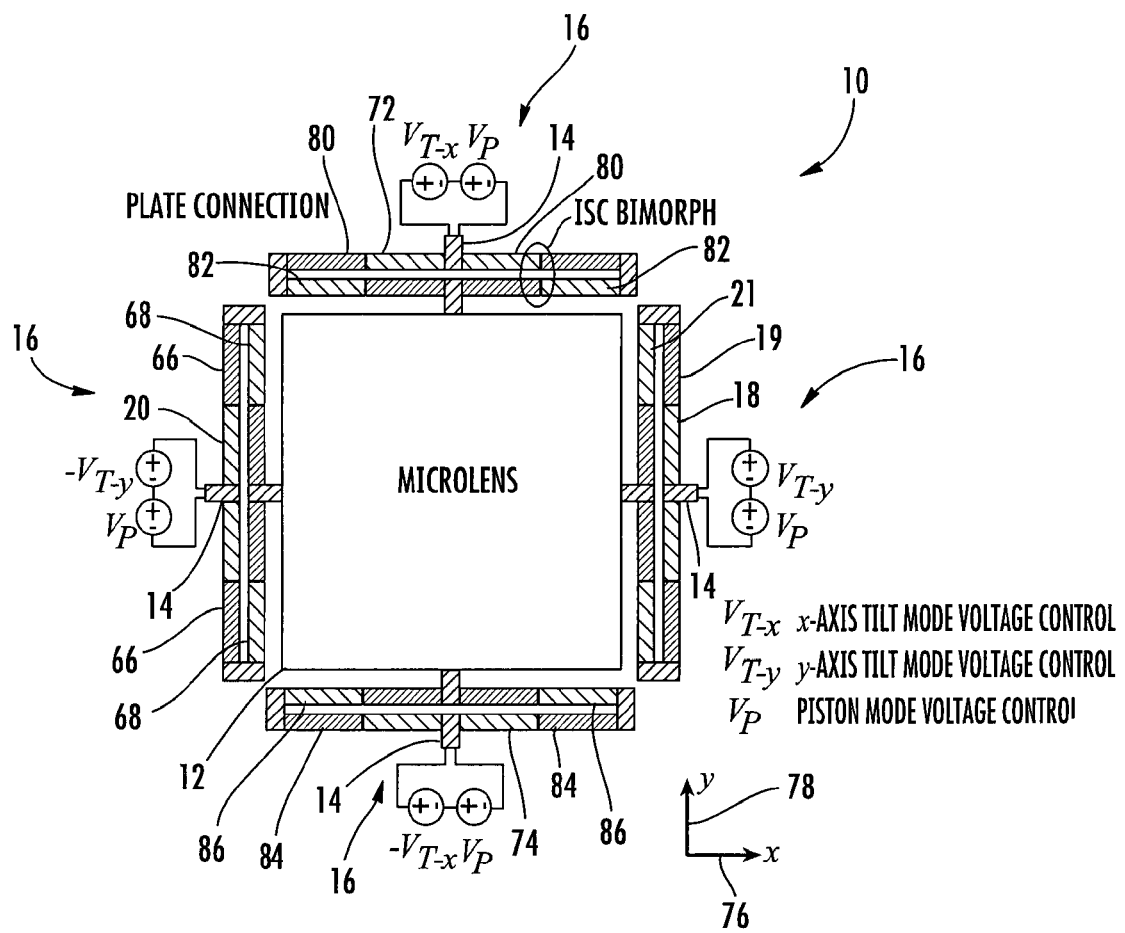
FIG. 30 is a top plan view of a vertical displacement device having four piezoelectric side actuator devices.
Figure 31:
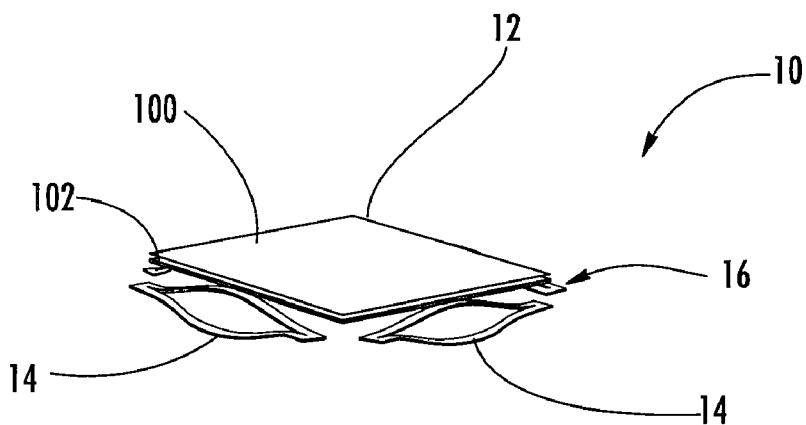
FIG. 31 is a perspective view of a vertical displacement device having a tunable capacitor.
Figure 32:
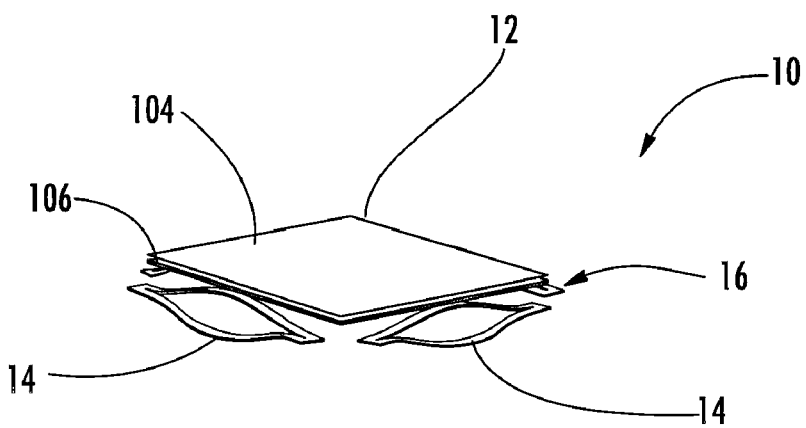
FIG. 32 is a perspective view of a vertical displacement device having a Fabry-Perot optical filter.
Figure 33:
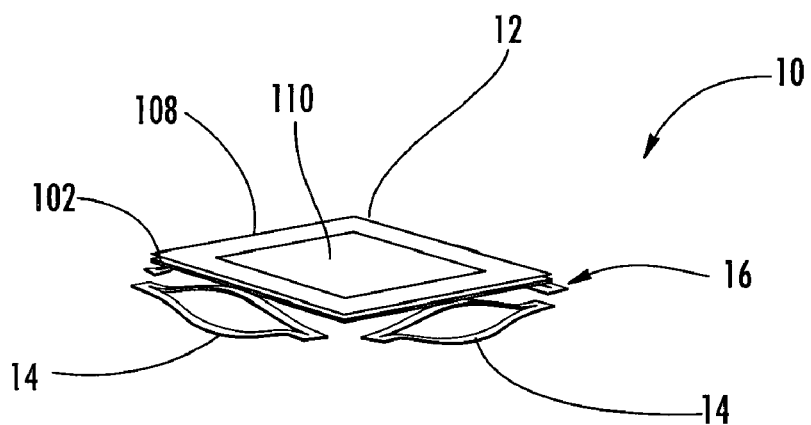
FIG. 33 is a perspective view of a vertical displacement device having an infrared detector.

As shown in FIGS. 1-33, this invention is directed to a vertical displacement device 10 capable of raising one or more vertically displaceable platforms 12 along a Z-axis relative to an anchor 14. In particular, vertical displacement device 10 may be capable of raising vertically displaceable platform 12 along a Z-axis so that vertically displaceable platform 12 remains generally parallel to anchor 14. The vertical displacement device 10 may also be capable of tilting the vertically displaceable platform 12 about the X-axis 76 and the Y-axis 78, as shown in FIGS. 29 and 30. Generally, the vertical displacement device 10 lies in a single plane while in an unactuated position. The vertical displacement device 10 may be moved along the Z-axis by applying a voltage to offset layers in piezoelectric applications and injecting a current to heaters in thermal applications. In at least one embodiment, vertical displacement device 10 is a microelectromechanical (MEMS) device that is capable of functioning on a small scale. For instance, the platform 12 may be displaced vertically about 56 μm and may rise to an elevation of about 84 μm. Vertically displaceable platform 12 may be, but is not limited to, a microlens, as shown in FIG. 30, a micromirror, as shown in FIG. 29, a micro-grating, as shown in FIG. 1, a needle 13, as shown in FIG. 3, a tunable capacitor 100, as shown in FIG. 31, an infrared detector 108, as shown in FIG. 33, a Fabry-Perot optical filter 104, as shown in FIG. 32, or other device. The tunable capacitor 100 may be formed from an electrode 102 positioned beneath the vertically displaceable platform 12. Varying the distance between the electrode 102 and the vertically displaceable platform 12 changes the capacitance. The optical filter 104 may be formed from a micromirror 106 positioned beneath the vertically displaceable platform 12. The infrared detector 108 may be formed from an infrared absorbable material 110 positioned on a top surface of the vertically displaceable platform 12 positioned above an electrode 102.

For a micromirror application, there exist important output parameters including applied voltage range, resonant frequency, static deflection, static angle, and power consumption. These expected parameters are summarized in Table 1.

TABLE 1

Expected output parameters of the device design.

| Parameter | Value |
| --- | --- |
| Voltage Range | 0-20 V |
| Resonant Frequency | 500 Hz-10 kHz |
| Static Deflection | 50-200 μm |
| Static Angle | 10-40° |
| Power Consumption | <100 mW for thermal |
| | <1 mW for piezoelectric |

Figure 2:
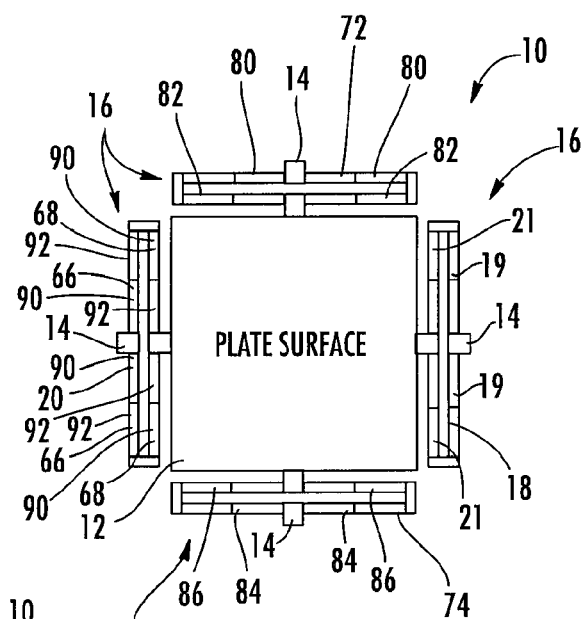
FIG. 2 is a top plan view of the vertical displacement device of FIG. 1.
Figure 3:
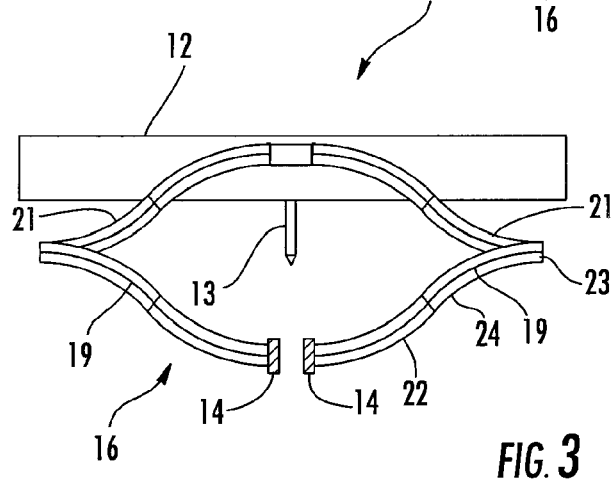
FIG. 3 is a side plan view of the vertical displacement device of FIG. 1.

Vertical displacement device 10, as shown in FIGS. 2, 29, and 30, may be formed from a plurality of actuation devices 16 positioned between a vertically displaceable platform 12 and an anchor 14. The actuation devices 16 may be positioned to enable vertical displacement of the vertically displaceable platform 12 and tilting of the vertically displaceable platform 12. In at least one embodiment, the vertical displacement device 10 may include a first side actuator device 18 positioned between the anchor 14 and the vertically displaceable platform 12, and a second side actuator device 20 positioned between the anchor 14 and the vertically displaceable platform 12. The second side actuator device 20 may be generally offset and parallel to the first side actuator device 18. As shown in FIGS. 1, 2, 29, and 30, the second side actuator device 20 may be positioned on an opposite side of the vertically displaceable platform 12 from the first side actuator device 18.

Figure 6:
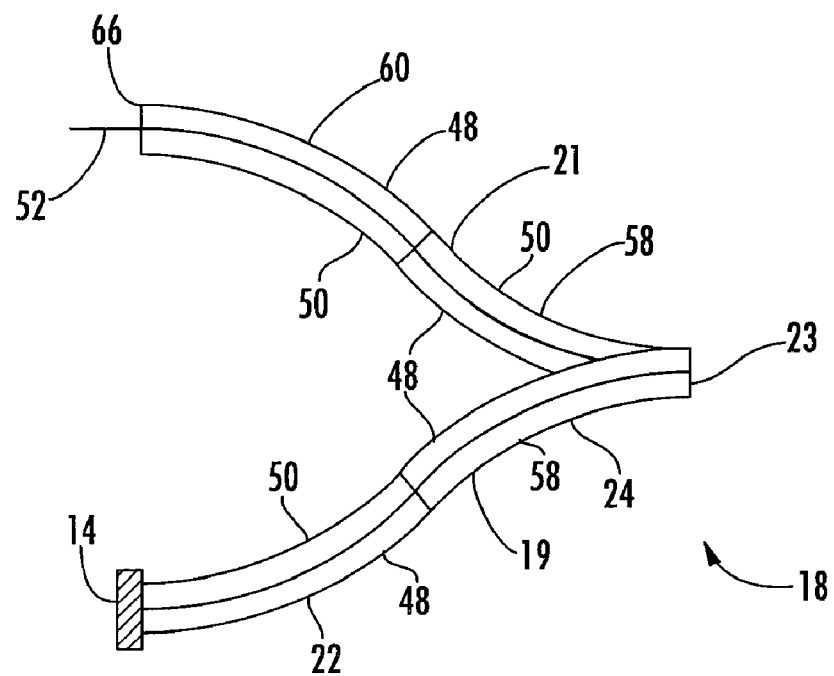
FIG. 6 is a side plan view of a side actuator device formed from first and second recurve actuators.
Figure 7:
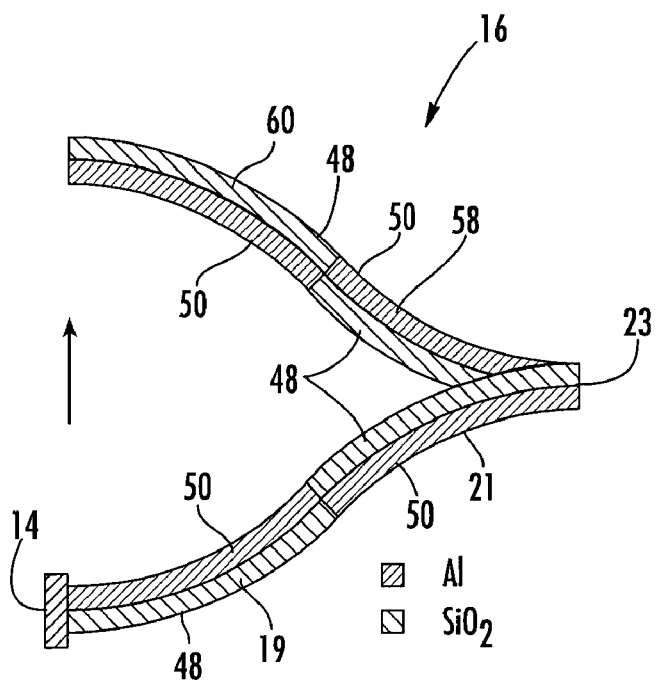
FIG. 7 is a side plan view of a thermal side actuator device of FIG. 6 actuated upward.
Figure 8:
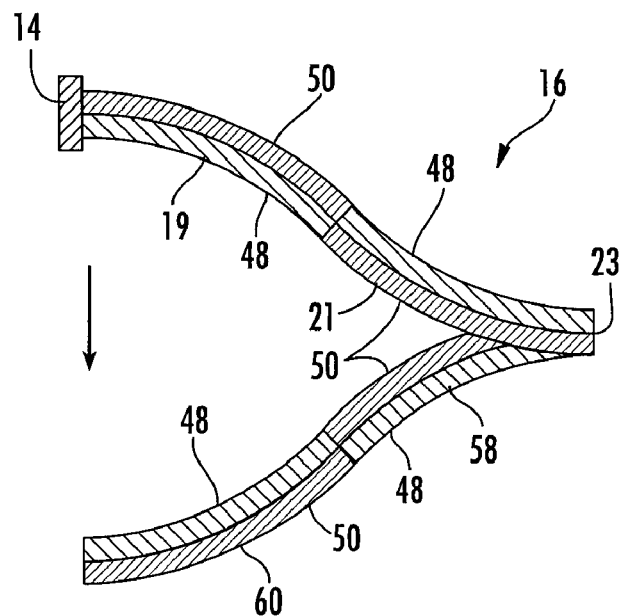
FIG. 8 is a side plan view of the thermal side actuator device of FIG. 6 actuated downward.
Figure 9:
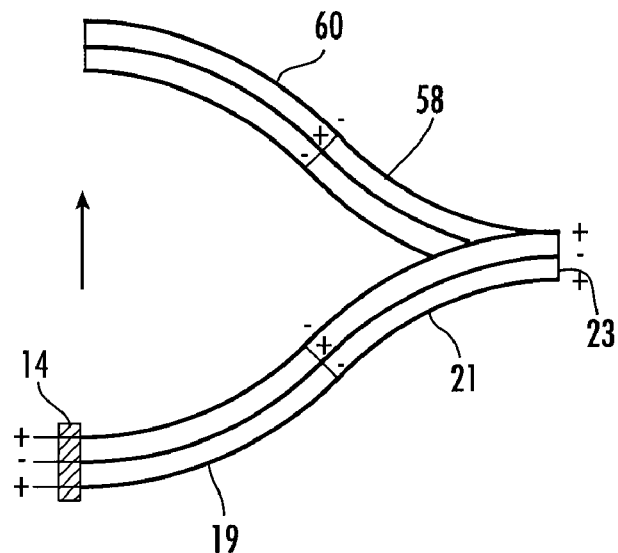
FIG. 9 is a side plan view of a piezoelectric side actuator device of FIG. 6 actuated upward.
Figure 10:
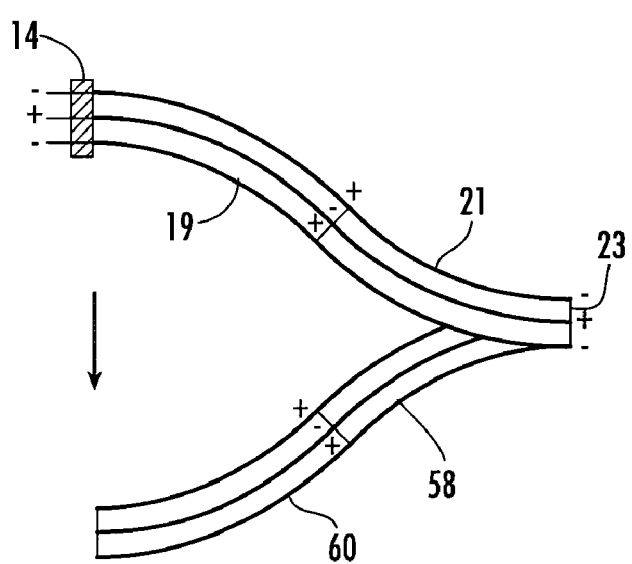
FIG. 10 is a side plan view of the piezoelectric side actuator device of FIG. 6 actuated downward.
Figure 11:
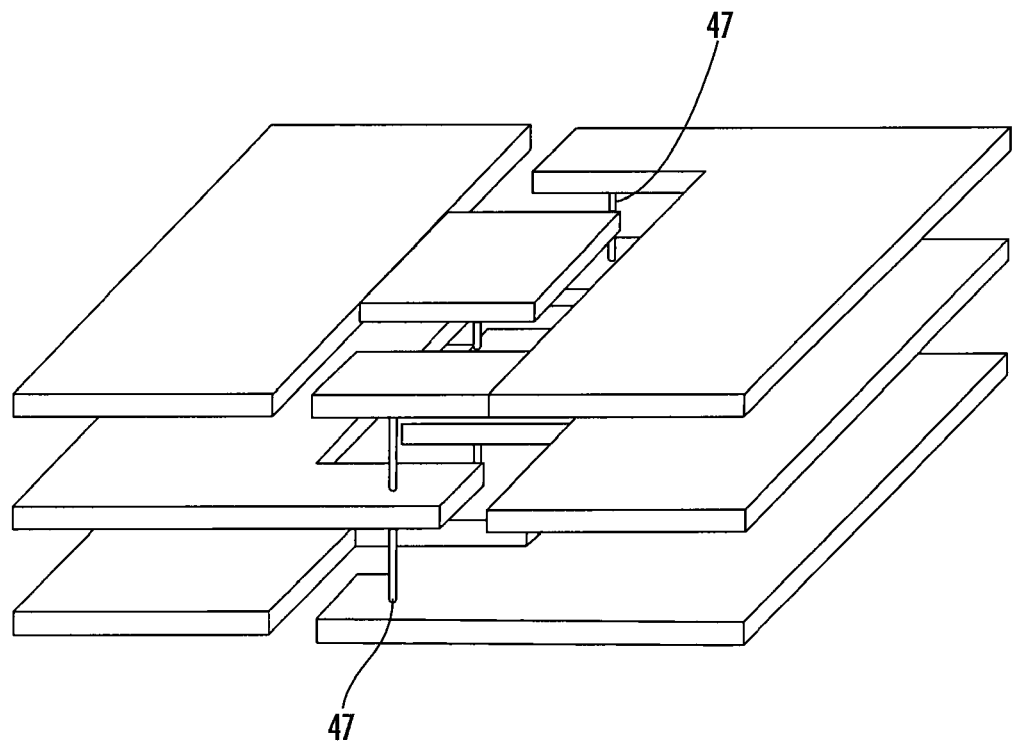
FIG. 11 is an exploded perspective view of an interface between first and second sections of a recurve actuator.
Figure 12:
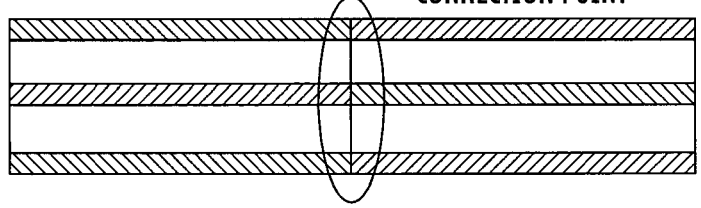
FIG. 12 is a side plan view of the recurve actuator shown in FIG. 11.

The first side actuator device 18 may be formed from a recurve actuator that forms a general S-shape when actuated. The side actuator device 18, as shown in FIGS. 1, 2, 29, and 30, may be formed from an inverted series connected (ISC) bimorph structure with alternating curvature. The actuator 18 may be formed from four bimorphs connected in series such that each section has a curvature that is inverted relative to an adjacent section. Any number of ISC actuators 18 may be attached end-to-end such that the vertical displacement is amplified by the number of ISC actuators 18. More specifically, as shown in FIG. 6, the actuator 18 may be formed from a first recurve actuator 19 attached to the anchor 14 and a second recurve actuator 21 attached to a second end 23 of the first recurve actuator 19. The first recurve actuator 19 may be formed from first section 22 that curves in a first direction and a second section 24 that curves in a second direction that is generally opposite to the first direction. The first section 22 may be formed from two materials having different coefficients of thermal expansion (CTE) positioned generally adjacent to each other. When heated, the material having the higher CTE causes the first section 22 to curve toward the side of the first section having the material with the lower CTE.

Figure 19:
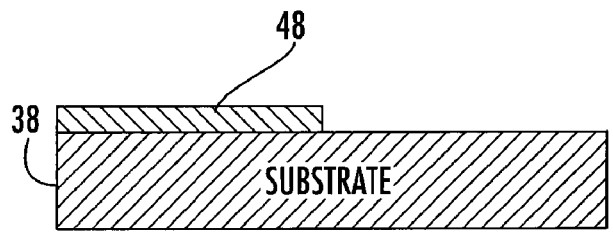
FIGS. 19-22 are side plan views showing a process of forming a thermal recurve actuator.
Figure 20:
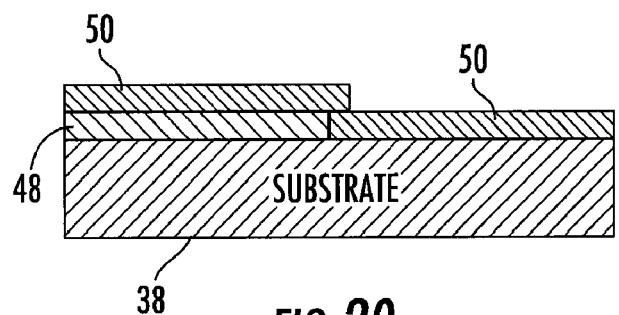
Figure 21:
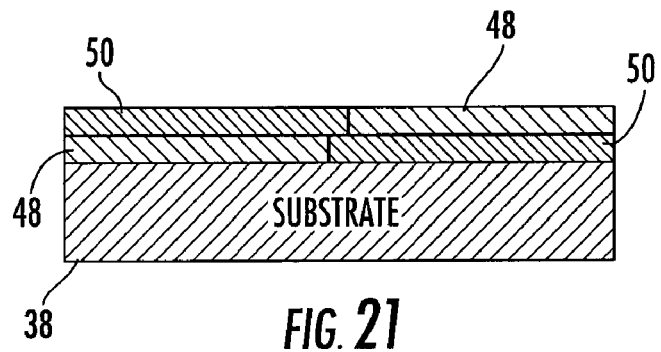
Figure 22:
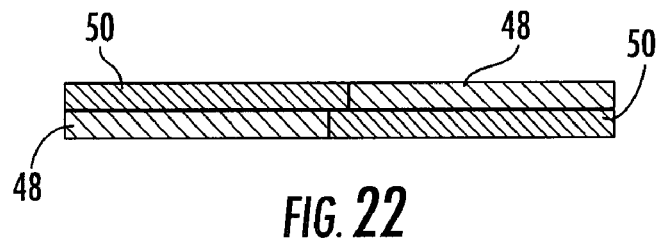
Figure 23:
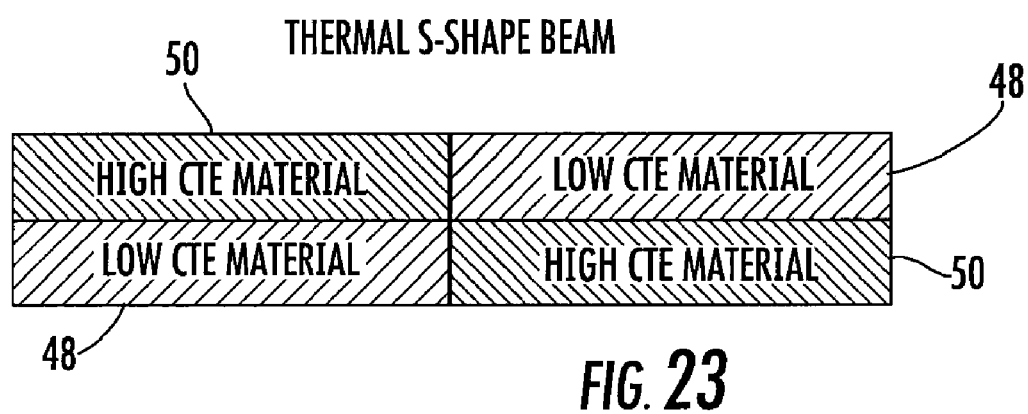
FIG. 23 is a side plan view of a thermal recurve actuator.
Figure 24:
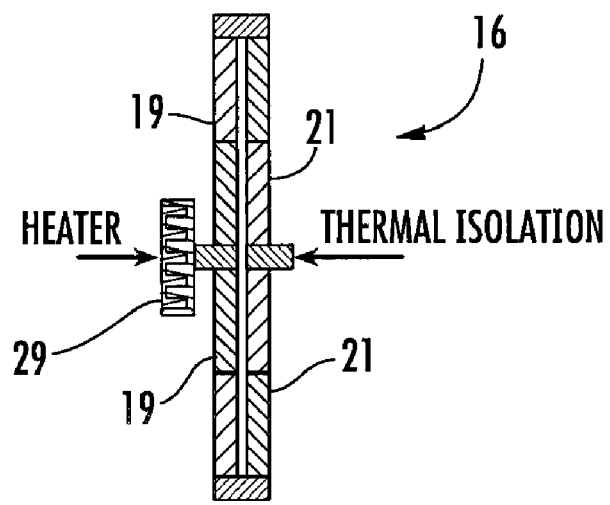
FIG. 24 is a top plan view of a thermal side actuator device.
Figure 25:
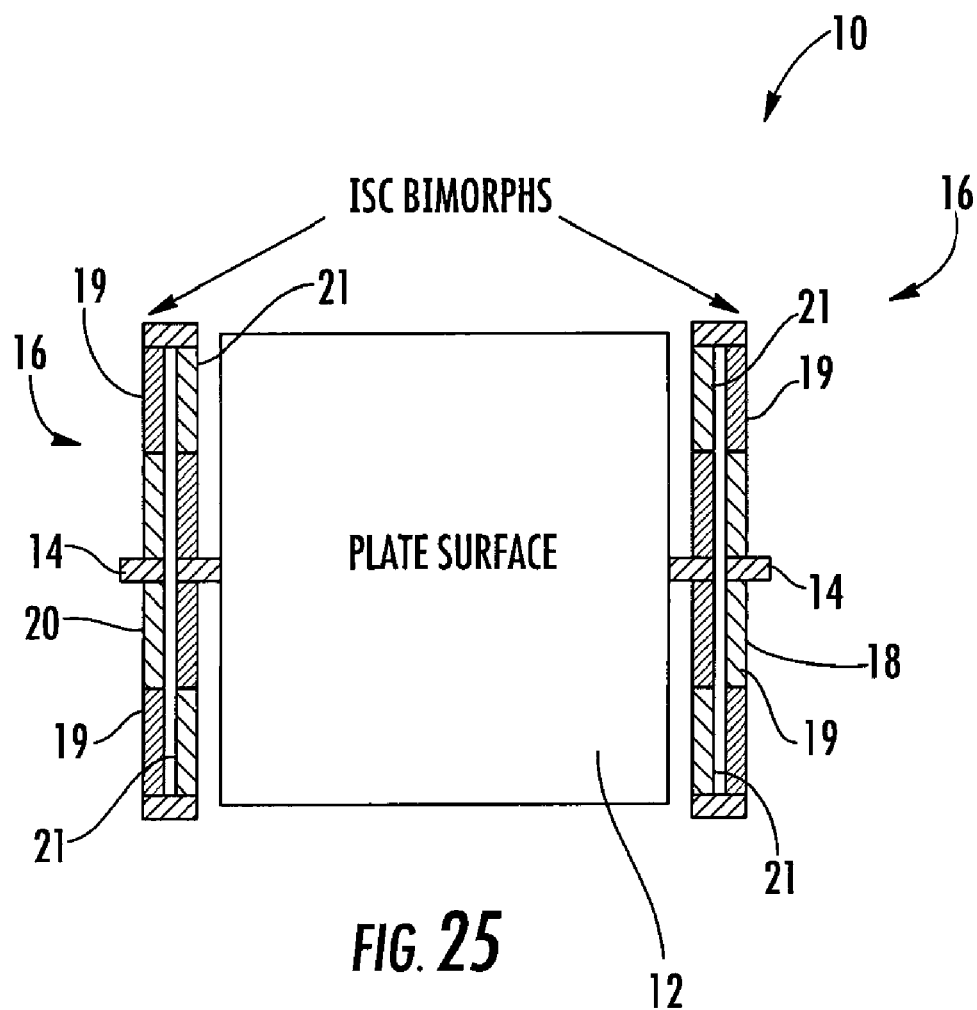
FIG. 25 is a top plan view of a vertical displacement device of this invention formed from a vertically displaceable platform attached to first and second side actuator devices.
Figure 26:
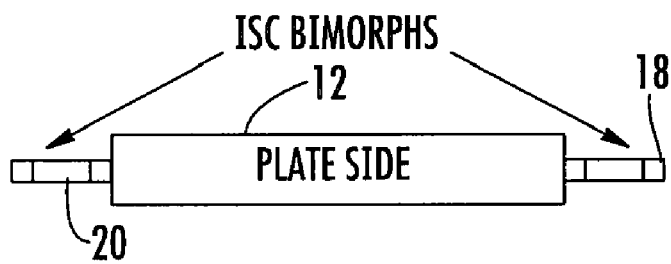
FIG. 26 is a side plan view of the vertical displacement device of FIG. 26.
Figure 27:
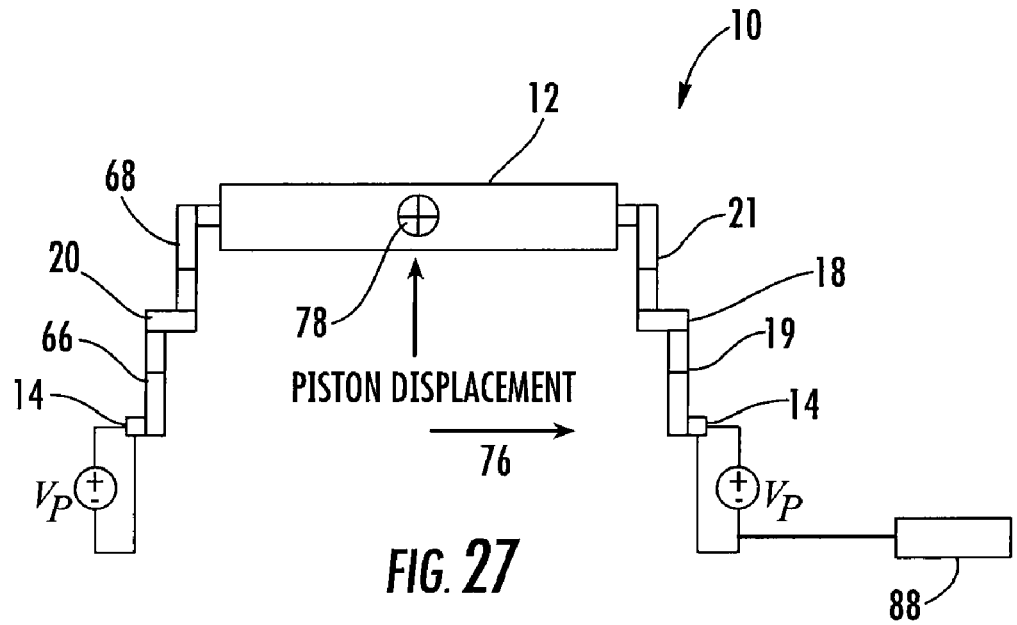
FIG. 27 is a front plan view of a vertical displacement device in which the vertically displaceable platform is vertically displaced from a resting position.
Figure 28:
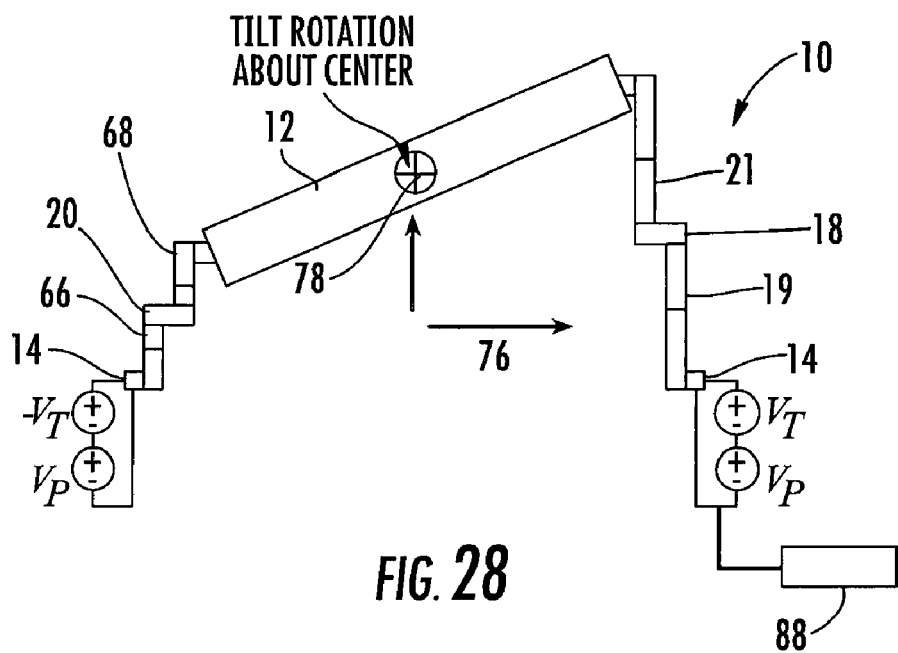
FIG. 28 is a front plan view of a vertical displacement device in which the vertically displaceable platform is vertically displaced from a resting position and tilted about an axis.

The actuator 18 may be formed from using a series of deposit and etch steps, as shown in FIGS. 19-22. The process of forming the actuator 18, as shown in FIG. 19, may include depositing a lower CTE material 48 on a substrate 38 and etching the material 48. The higher CTE material 50, with a CTE that is greater than a CTE for the lower CTE material 48, may be deposited on the lower CTE material 48, as shown in FIG. 20. In addition, the lower CTE material 48 may be deposited on the higher CTE material 50, as shown in FIG. 21, and the actuator 18 may be removed from the substrate 38. Attention must be paid to forming the conformal deposit of the high CTE material 50 layer to ensure proper function of the actuator 18. In embodiments in which materials having different CTEs are used, a heater 29 may be included, as shown in FIG. 24. A heater 29 may be attached to each of the side actuator devices, 18, 20, 72, and 74. Attaching the heater 29 to the end of the actuators 18, 20, 72, and 74 causes a uniform temperature distribution to exist about the length of the actuators 18, 20, 72, and 74. Thermal isolation plates 31, as shown in FIG. 29, may be used to attach the vertically displaceable platform 12 to the side actuator devices, 18, 20, 72, and 74.

Figure 17:
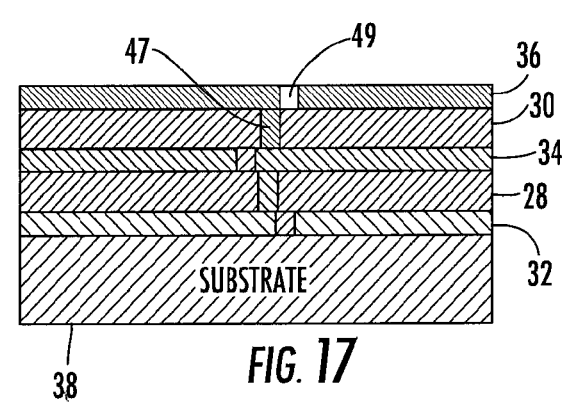
Figure 18:
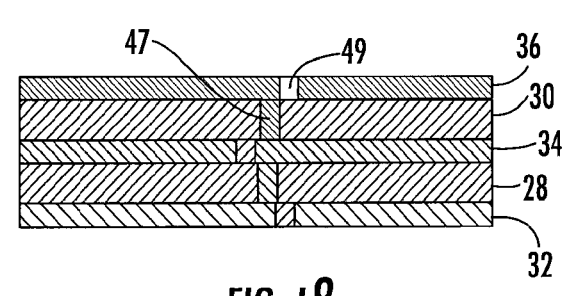

In another embodiment, the materials used to form the actuator 18 may include a piezoelectric bimorph in which the two materials are the same piezoelectric bimorph materials 28, 30 separated by metal electrodes 32, 34, 36, as shown in FIGS. 17 and 18. A positive electric field in a piezoelectric bimorph material 28, 30 causes a contraction or expansion of the material, and a negative electric field in the same piezoelectric bimorph materials 28, 30 causes an opposite expansion or contraction. The material forming the piezoelectric bimorph materials 28, 30 may be suitable piezoelectric materials such as lead zirconium titanate (PZT), and the metal electrodes 32, 34, 36 may be, but is not limited to being, formed from Pt/Ti.

Figure 13:
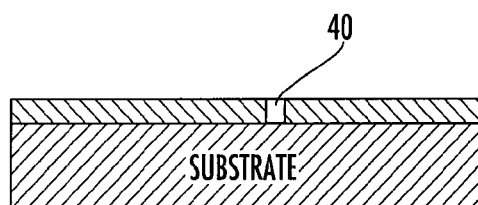
FIGS. 13-18 are side plan views showing a process of forming a piezoelectric recurve actuator.
Figure 16:
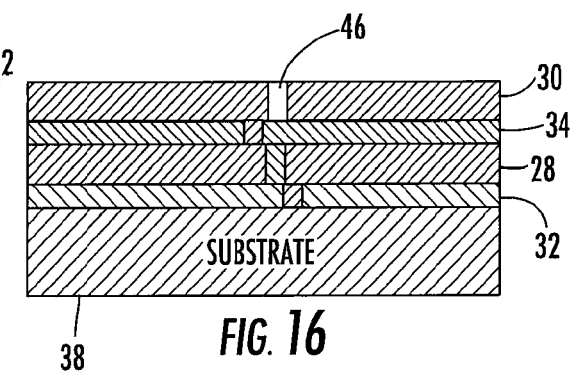
Figure 14:
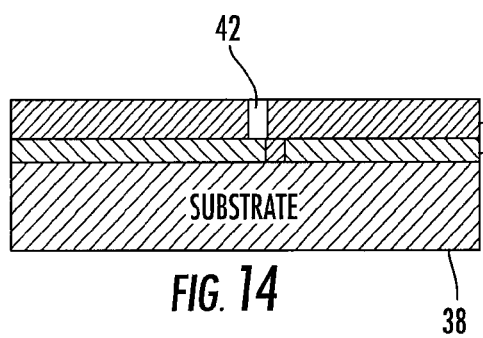
Figure 15:
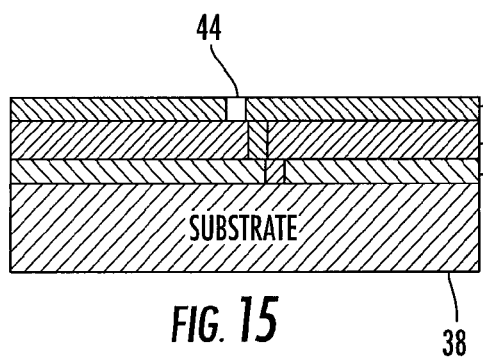

An actuator 18 formed from piezoelectric materials may be formed as shown in FIGS. 13-18. In particular, as shown in FIG. 13, the first metal electrode material 32 may be deposited on a substrate 38 such that a cavity 40 is formed. A first piezoelectric bimorph material 28 may be deposited, as shown in FIG. 14, on the first metal electrode material 32 and in cavity 40, and may form cavity 42. A second metal electrode material 34 may be deposited on the first piezoelectric bimorph material 28 and in cavity 42, thereby connecting the first and second metal electrode materials 32, 34, as shown in FIG. 15. In addition, a cavity 44 may be formed. A second piezoelectric bimorph material 30 may be deposited, as shown in FIG. 16, on the second metal electrode material 34 and in cavity 44, and may form cavity 46. A third metal electrode material 36 may be deposited on the second piezoelectric bimorph material 30 and in cavity 46, thereby connecting the first, second, and third metal electrode materials 32, 34, 36, as shown in FIG. 17. In addition, a cavity 49 may be formed. The piezoelectric materials may then be removed from the substrate 38, as shown in FIG. 18.

The cavities 40, 42, 44, and 46 in the piezoelectric materials form vias 47 to provide an electrical conduit connecting the metal electrodes 32, 34, and 36 together. The vias 47 allow voltages to be applied to the beginning of the actuators 18, 20, 72, and 74 and propagate along the appropriate metal electrodes 32, 34, and 36. The vias 47 enable efficient operation of the vertical displacement device 10 when used with piezoelectric materials.

Figure 4:
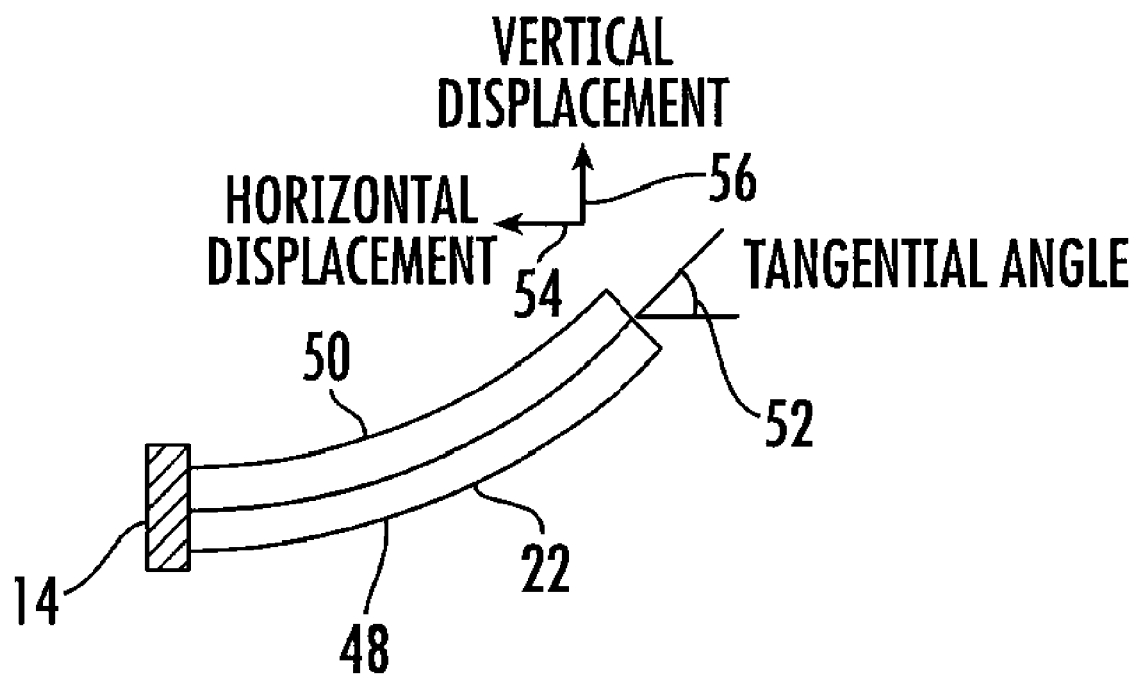
FIG. 4 is a side plan view of a first section of a recurve actuator.
Figure 5:
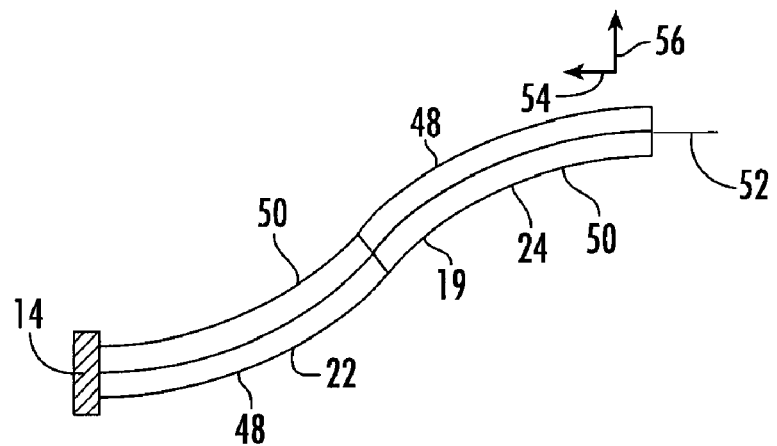
FIG. 5 is a side plan view of a recurve actuator formed from first and second sections.

The second section 24 of the first recurve actuator 19 is configured to curve in a direction that is generally opposite to the direction of curvature of the first section 22 of the actuator 19. Such action causes the tangential angle 52, as shown in FIG. 4, to return to zero, as shown in FIG. 5. Actuation of the first and second sections 22, 24 of the first recurve actuator 19 causes horizontal and vertical displacement, as shown with arrows 54, 56 respectively.

The second recurve actuator 21 may be attached to the second end 23 of the first recurve actuator 19. The second recurve actuator 21 may be formed from a first section 58 and a second section 60 similar to the first recurve actuator 19. The first section 58 may be formed from two materials having different CTE, may be formed from piezoelectric materials, or may be formed from other appropriate materials enabling curvature of the material to occur. The first section 58 may be configured to curve in a first direction, and the second section 60 may be configured to curve in a second direction generally opposite to the first direction. In embodiments in which materials having different CTEs are used, the first section 58 may have a lower CTE material 48 on the bottom and a higher CTE material 50 on the top, and the second section 60 may have a higher CTE material 50 on the bottom and a lower CTE material 48 on the top. Such a configuration enables vertical displacement of point 66 with no horizontal displacement and tangential angle rotation.

The vertical displacement device 10 may also include a second side actuator device 20 positioned opposite to the first side actuator device 18. The second side actuator device 20 may be formed from the same structure forming the first side actuator device 18, as shown in FIG. 6. In at least one embodiment, the second side actuator device 20 may be positioned generally parallel to and offset from the first side actuator device 18. The second side actuator device 20 may be formed from a first recurve actuator 66 and a second recurve actuator 68. Both the first and second recurve actuators 66, 68 may be formed from first sections 90 and second sections 92 and configured to operate as an ISC bimorph structure, as described above.

By positioning the first and second side actuators 18, 20 offset from each other, the actuators 18, 20 may be used to raise and lower the vertically displaceable platform 12. In addition, the first and second side actuators 18, 20 may be used to tilt the vertically displaceable platform 12. The vertically displaceable platform 12 may be configured for specific uses. For instance, the vertically displaceable platform 12 may include a micromirror, a microlens, a tunable micrograting, a tunable capacitor 100, an infrared detector 108, and a Fabry-Perot optical filter 104. The micromirror and all other MEMS devices discussed may be fabricated using a deep reactive-ion-etch (DRIE) complementary metal oxide semiconductor (CMOS)—MEMS process, which is described in detail at "Post—CMOS Processing for High-Aspect-Ratio Integrated Silicon Microstructures" by H. Xie, L. Erdmann, X. Zhu, K. Gabriel, and G. Fedder in the *Journal of Microelectromechanical Systems*, 11 (2002) 93-101.

In at least one embodiment, as shown in FIGS. 1, 2, 25, 29, and 30, the first side actuator device 18 may be formed from two combinations of first and second recurve actuators 19, 21. For instance, the combinations of first and second recurve actuators 19, 21 may be positioned parallel to and inline with each other. The first recurve actuators 19 may also be positioned generally at 180 degrees relative to each other, as shown in FIG. 3. In an alternative embodiment, the first recurve actuators 19 may be positioned generally in the same orientation.

As shown in FIGS. 1, 2, 29, and 30, the vertically displaceable platform 12 may be supported with third and fourth side actuator devices 72, 74. The third and fourth side actuator devices 72, 74 may assist in displacing the vertically displaceable platforms 12. The third and fourth side actuator devices 72, 74 also enable rotation, or tilt, of the vertically displaceable platform 12 around an X-axis 76 that is orthogonal to a Y-axis 78 about which the vertically displaceable platform 12 rotates due to the movement of the first side actuator device 18 and the second side actuator device 20. Thus, the vertical displacement device 10 enables two dimensional (2D) movement of the vertically displaceable platform 12.

The third and fourth side actuator devices 72, 74 may be configured to be substantially identical to the first and second side actuator devices 18, 20. The third and fourth side actuator devices 72, 74 may be formed from one or more recurve actuators. As shown in FIGS. 29 and 30, the third and fourth side actuator devices 72, 74 may each be formed from two recurve actuators. The third side actuator device 72 may be formed from a first recurve actuator 80 and a second recurve actuator 82. Each recurve actuator 80, 82 may be formed from a first and second section as previously discussed. Similarly, the fourth side actuator device 74 may be formed from a first recurve actuator 84 and a second recurve actuator 86. Each recurve actuator 80, 82, 84, and 86 may be formed from a first and second section as previously discussed. In at least one embodiment, the third and fourth side actuator devices 72, 74 may each be formed from two sets of first and second recurve actuators 80, 82 and 84, 86.

The vertical displacement device 10 may be used in many different applications, as previously discussed. During use, a controller 88 sends a voltage to the actuators 18, 20, 72 and 74 to establish an initial point. The vertically displaceable platform 12 may be moved vertically by applying an equal voltage to all of the actuators 18, 20, 72 and 74. A positive voltage moves the vertically displaceable platform 12 in a first direction, and a negative voltage moves the vertically displaceable platform 12 in a second direction generally opposite to the first direction. The vertically displaceable platform 12 may be tilted by moving an actuator 18, 20, 72 or 74 relative to an opposite actuator 18, 20, 72 and 74. For example, the first side actuator device 18 may be moved relative to the second side actuator device 20 to rotate the vertically displaceable platform 12 about the y-axis 78. Such movement may be accomplished in at least two ways. For instance, the first side actuator device 18 may be moved through application of a positive or negative voltage while the second side actuator device 20 remains in the same position. In another scenario, the first side actuator device 18 may be moved a greater distance or moved in an opposite direction relative to the second side actuator device 20. Alternatively, the second side actuator device 20 may be moved relative to the first side actuator device 18.

The vertical displacement device 10 may also be rotated about the x-axis 76 to create 2D movement by moving the third or fourth side actuator 72, 74, relative to the other. Movement of the third or fourth side actuator 72, 74 may be completed as previously set forth for movement of the first and second side actuators 18, 20.

In other embodiments, vertically displaceable platform 12 may include a microlens. The microlens may be fabricated from a membrane, such as, but not limited to, a SCS, which is generally transparent to infrared light. Thus, the SCS microlens may be widely used in fiber-optic communications in which infrared lasers, such as, but not limited to, 1.3 μm and 1.55 μm lasers, are the light sources. The microlens may be an attached microlens, an integrated microlens, or other devices.

In yet another embodiment, vertically displaceable platform 12 may include a tunable microlens that may be fabricated by injecting one or more droplets of a polymer material, such as but not limited to, photoresist, onto the hollow platform. While vertically displaceable platform 12 has been described as including a micromirror, as shown in FIG. 29, a microlens, as shown in FIG. 30, and a tunable micro-grating, as shown in FIG. 1, the vertically displaceable platform 12 is not limited to containing only these items. Rather, vertically displaceable platform 12 may include other appropriate items as well.

The foregoing is provided for purposes of illustrating, explaining, and describing embodiments of this invention. Modifications and adaptations to these embodiments will be apparent to those skilled in the art and may be made without departing from the scope or spirit of this invention.

We claim:

1. A MEMS vertical displacement device, comprising:
   an anchor;
   a vertically displaceable platform that lies in a plane while in an unactuated position, the vertically displaceable platform including a first side and a second side that is opposite and substantially parallel to the first side;
   a first side actuator device attached to the anchor at one end and attached to the first side of the vertically displaceable platform at another end, the first side actuator device including:
      a first recurve actuator that lies in the unactuated plane while in an unactuated position, the first recurve actuator having a first section that curves in a first direction and a second section that curves in a second direction that is generally opposite to the first direction when actuated, wherein a first end of the first recurve actuator is attached to the anchor; and
      a second recurve actuator that lies in the unactuated plane and is substantially in parallel with the first recurve actuator while in an unactuated position, the second recurve actuator having a first section that curves in a first direction and a second section that curves in a second direction that is generally opposite to the first direction when actuated, wherein a first end of the second recurve actuator is attached to a second end of the first recurve actuator;
   wherein the first side actuator device is substantially parallel to the first side of the vertically displaceable platform and is adapted to create vertical displacement of the first side of the vertically displaceable platform when actuated; and
   a second side actuator device attached to the anchor at one end and attached to the second side of the vertically displaceable platform at another end, wherein the second side actuator device is substantially parallel to the second side of the vertically displaceable platform and is adapted to create vertical displacement of the vertically displaceable platform.

2. The MEMS vertical displacement device of claim 1, wherein the second side actuator device that is adapted to create vertical displacement comprises
- a first recurve actuator that lies in the unactuated plane while in an unactuated position, the first recurve actuator having a first section that curves in a first direction and a second section that curves in a second direction that is generally opposite to the first direction when actuated, wherein a first end of the first recurve actuator is attached to the anchor, and
- a second recurve actuator that lies in the unactuated plane and is substantially in parallel with the first recurve actuator while in an unactuated position, the second recurve actuator having a first section that curves in a first direction and a second section that curves in a second direction that is generally opposite to the first direction when actuated, wherein a first end of the second recurve actuator is attached to a second end of the first recurve actuator;
- wherein the second side of the vertically displaceable platform is vertically displaced above the unactuated plane when the second side actuator device is actuated.

3. A MEMS vertical displacement device, comprising:
an anchor;
a vertically displaceable platform;
a first side actuator device attached to the anchor at one end and attached to the vertically displaceable platform at another end, wherein the first side actuator device is adapted to create vertical displacement, wherein the first side actuator device comprises:
- a first recurve actuator having a first section that curves in a first direction and a second section that curves in a second direction that is generally opposite to the first direction, wherein a first end of the first recurve actuator is attached to the anchor, and
- a second recurve actuator having a first section that curves in a first direction and a second section that curves in a second direction that is generally opposite to the first direction, wherein a first end of the second recurve actuator is attached to a second end of the first recurve actuator, such that when actuated a second end of the second recurve actuator is vertically displaced above the anchor,
wherein the first section of the first recurve actuator is formed from a top having a coefficient of thermal expansion that is higher than a coefficient of thermal expansion for an adjacent bottom; and wherein the second section of the first recurve actuator is formed from a top having a coefficient of thermal expansion that is lower than a coefficient of thermal expansion for an adjacent bottom; and
a second side actuator device attached to the anchor at one end and attached to the vertically displaceable platform at another end, wherein the second side actuator device is adapted to create vertical displacement and the second side actuator device is generally parallel to and offset from the first side actuator device.

4. The MEMS vertical displacement device of claim 3, wherein the first section of the second recurve actuator is formed from a top having a coefficient of thermal expansion that is higher than a coefficient of thermal expansion for an adjacent bottom; and wherein the second section of the second recurve actuator is formed from a top having a coefficient of thermal expansion that is lower than a coefficient of thermal expansion for an adjacent bottom.

5. The MEMS vertical displacement device of claim 3, wherein the second side actuator device that is adapted to create vertical displacement comprises:
- a first recurve actuator having a first section that curves in a first direction and a second section that curves is a second direction that is generally opposite to the first direction, wherein a first end of the first recurve actuator is attached to the anchor, and
- a second recurve actuator having a first section that curves in a first direction and a second section that curves is a second direction that is generally opposite to the first direction, wherein a first end of the second recurve actuator is attached to a second end of the first recurve actuator, such that when actuated a second end of the second recurve actuator is vertically displaced above the anchor.

6. The MEMS vertical displacement device of claim 5, wherein the first section of the first recurve actuator of the second side actuator device is formed from a top having a coefficient of thermal expansion that is higher than a coefficient of thermal expansion for an adjacent bottom; and wherein the second section of the first recurve actuator of the second side actuator device is formed from a top having a coefficient of thermal expansion that is lower than a coefficient of thermal expansion for an adjacent bottom.

7. The MEMS vertical displacement device of claim 6, wherein the first section of the second recurve actuator of the second side actuator device is formed from a top having a coefficient of thermal expansion that is higher than a coefficient of thermal expansion for an adjacent bottom; and wherein the second section of the second recurve actuator of the second side actuator device is formed from a top having a coefficient of thermal expansion that is lower than a coefficient of thermal expansion for an adjacent bottom.

8. The MEMS vertical displacement device of claim 3, further comprising a third side actuator device attached to the anchor at one end and attached to the vertically displaceable platform at another end, wherein the third side actuator device is adapted to create vertical displacement and is generally nonparallel with the first side actuator device.

9. The MEMS vertical displacement device of claim 8, wherein the third side actuator device that is adapted to create vertical displacement comprises:
- a first recurve actuator having a first section that curves in a first direction and a second section that curves is a second direction that is generally opposite to the first direction, wherein a first end of the first recurve actuator is attached to the anchor, and
- a second recurve actuator having a first section that curves in a first direction and a second section that curves is a second direction that is generally opposite to the first direction, wherein a first end of the second recurve actuator is attached to a second end of the first recurve actuator, such that when actuated a second end of the second recurve actuator is vertically displaced above the anchor.

10. The MEMS vertical displacement device of claim 9, wherein the first section of the first recurve actuator of the third side actuator device is formed from a top having a coefficient of thermal expansion that is higher than a coefficient of thermal expansion for an adjacent bottom; and wherein the second section of the first recurve actuator of the third side actuator device is formed from a top having a coefficient of thermal expansion that is lower than a coefficient of thermal expansion for an adjacent bottom.

11. The MEMS vertical displacement device of claim 10, wherein the first section of the second recurve actuator of the third side actuator device is formed from a top having a coefficient of thermal expansion that is higher than a coefficient of thermal expansion for an adjacent bottom; and wherein the second section of the second recurve actuator of the second side actuator device is formed from a top having a coefficient of thermal expansion that is lower than a coefficient of thermal expansion for an adjacent bottom.

12. The MEMS vertical displacement device of claim 8, further comprising a fourth side actuator device attached to the anchor at one end and attached to the vertically displaceable platform at another end, wherein the fourth side actuator device is adapted to create vertical displacement and the fourth side actuator device is aligned with and offset from the third side actuator device.

13. The MEMS vertical displacement device of claim 12, wherein the fourth side actuator device that is adapted to create vertical displacement comprises:
a first recurve actuator having a first section that curves in a first direction and a second section that curves is a second direction that is generally opposite to the first direction, wherein a first end of the first recurve actuator is attached to the anchor, and a second recurve actuator having a first section that curves in a first direction and a second section that curves is a second direction that is generally opposite to the first direction, wherein a first end of the second recurve actuator is attached to a second end of the first recurve actuator, such that when actuated a second end of the second recurve actuator is vertically displaced above the anchor.

14. The MEMS vertical displacement device of claim 13, wherein the first section of the first recurve actuator of the fourth side actuator device is formed from a top having a coefficient of thermal expansion that is higher than a coefficient of thermal expansion for an adjacent bottom; and wherein the second section of the first recurve actuator of the fourth side actuator device is formed from a top having a coefficient of thermal expansion that is lower than a coefficient of thermal expansion for an adjacent bottom.

15. The MEMS vertical displacement device of claim 14, wherein the first section of the second recurve actuator of the fourth side actuator device is formed from a top having a coefficient of thermal expansion that is higher than a coefficient of thermal expansion for an adjacent bottom; and wherein the second section of the second recurve actuator of the fourth side actuator device is formed from a top having a coefficient of thermal expansion that is lower than a coefficient of thermal expansion for an adjacent bottom.

16. The MEMs vertical displacement device of claim 12, wherein the third and fourth side actuator devices are formed from piezoelectric bimorphs.

17. The MEMS vertical displacement device of claim 3, wherein the vertically displaceable platform comprises a microlens.

18. The MEMS vertical displacement device of claim 3, wherein the vertically displaceable platform comprises a micromirror.

19. The MEMS vertical displacement device of claim 3, wherein the vertically displaceable platform comprises a micro-grating.

20. The MEMS vertical displacement device of claim 3, wherein the vertically displaceable platform comprises a tunable capacitor.

21. The MEMS vertical displacement device of claim 3, wherein the vertically displaceable platform comprises an infrared detector.

22. The MEMS vertical displacement device of claim 3, wherein the vertically displaceable platform comprises an optical filter.

23. The MEMS vertical displacement device of claim 3, wherein the vertically displaceable platform comprises a needle.

24. A MEMS vertical displacement device, comprising:
an anchor;
a platform that lies in a plane while in an unactuated position and is vertically displaceable from the unactuated plane;
a first side actuator device comprising:
at least one first recurve actuator that lies in the unactuated plane while in an unactuated position, the at least one first recurve actuator having a first section with a first end attached to the anchor and a second end, wherein the first section curves in a first direction when activated, and a second section having a first end attached to the second end of the first section, wherein the second section curves when activated in a second direction that is generally opposite to the first direction; and
at least one second recurve actuator that lies in the unactuated plane and is substantially in parallel with the first recurve actuator while in an unactuated position, the at least one second recurve actuator having a first section with a first end attached to a second end of the second section of the at least one first recurve actuator and a second end, wherein the first section curves in a first direction when activated, and a second section having a first end attached to the second end of the first section, wherein the second section curves when activated in a second direction that is generally opposite to the first direction, wherein the vertically displaceable platform is attached to a second end of the second section of the at least one second recurve actuator; and
a second side actuator device offset from the first side actuator device on an opposite side of the anchor from the first side actuator device, comprising:
at least one first recurve actuator that lies in the unactuated plane while in an unactuated position, the at least one first recurve actuator having a first section with a first end attached to the anchor and second end, wherein the first section curves in a first direction when activated, and a second section having a first end attached to the second end of the first section, wherein the second section curves when activated in a second direction that is generally opposite to the first direction; and
at least one second recurve actuator that lies in the unactuated plane and is substantially in parallel with the first recurve actuator while in an unactuated position, the at least one second recurve actuator having a first section with a first end attached to a second end of the second section of the at least one first recurve actuator and a second end, wherein the first section curves in a first direction when activated, and a second section having a first end attached to the second end of the first section, wherein the second section curves when activated in a second direction that is generally opposite to the first direction, wherein a second end of the second section is attached to the vertically displaceable platform.

25. The MEMS vertical displacement device of claim 24, wherein the first side actuator device, the at least one first recurve actuator of the first side actuator device, and the at least one second recurve actuator of the first side actuator device comprises a first actuator formed from a first recurve actuator coupled to the anchor and a second recurve actuator coupled to a second end of the first recurve actuator and coupled to the vertically displaceable platform and a second actuator aligned with the first actuator and formed from a first recurve actuator coupled to the anchor and a second recurve actuator coupled to a second end of the first recurve actuator and coupled to the vertically displaceable platform.

26. The MEMS vertical displacement device of claim 25, wherein the second side actuator device, the at least one first recurve actuator of the second side actuator device, and the at least one second recurve actuator of the second side actuator device comprises a first actuator formed from a first recurve actuator coupled to the anchor and a second recurve actuator coupled to a second end of the first recurve actuator and coupled to the vertically displaceable platform and a second actuator aligned with the first actuator and formed from a first recurve actuator coupled to the anchor and a second recurve actuator coupled to a second end of the first recurve actuator and coupled to the vertically displaceable platform.

27. The MEMS vertical displacement device of claim 26, further comprising a third side actuator device comprising:
   at least one first recurve actuator having a first section with a first end attached to the anchor and a second end, wherein the first section curves in a first direction when activated, and a second section having a first end attached to the second end of the first section, wherein the second section curves when activated in a second direction that is generally opposite to the first direction; and
   at least one second recurve actuator having a first section with a first end attached to a second end of the at least one first recurve actuator and a second end, wherein the first section curves in a first direction when activated, and a second section having a first end attached to the second end of the first section, wherein the second section curves when activated in a second direction that is generally opposite to the first direction.

28. The MEMS vertical displacement device of claim 27, wherein the third side actuator device, the at least one first recurve actuator of the third side actuator device, and the at least one second recurve actuator of the third side actuator device comprises a first actuator formed from a first recurve actuator coupled to the anchor and a second recurve actuator coupled to a second end of the first recurve actuator and coupled to the vertically displaceable platform and a second actuator aligned with the first actuator and formed from a first recurve actuator coupled to the anchor and a second recurve actuator coupled to a second end of the first recurve actuator and coupled to the vertically displaceable platform.

29. The MEMS vertical displacement device of claim 28, further comprising a fourth side actuator device on an opposite side of the anchor from the third side actuator device, comprising:
   at least one first recurve actuator having a first section with a first end attached to the anchor and second end, wherein the first section curves in a first direction when activated, and a second section having a first end attached to the second end of the first section, wherein the second section curves when activated in a second direction that is generally opposite to the first direction;
   at least one second recurve actuator having a first section with a first end attached to a second end of the at least one first recurve actuator and a second end, wherein the first section curves in a first direction when activated, and a second section having a first end attached to the second end of the first section, wherein the second section curves when activated in a second direction that is generally opposite to the first direction.

30. The MEMS vertical displacement device of claim 29, wherein the fourth side actuator device, the at least one first recurve actuator of the fourth side actuator device, and the at least one second recurve actuator of the fourth side actuator device comprises a first actuator formed from a first recurve actuator coupled to the anchor and a second recurve actuator coupled to a second end of the first recurve actuator and coupled to the vertically displaceable platform and a second actuator aligned with the first actuator and formed from a first recurve actuator coupled to the anchor and a second recurve actuator coupled to a second end of the first recurve actuator and coupled to the vertically displaceable platform.

31. The MEMs vertical displacement device of claim 24, wherein the first and second side actuator devices are formed from piezoelectric bimorphs.

* * * * *